(12) United States Patent
Amano

(10) Patent No.: US 12,078,770 B2
(45) Date of Patent: Sep. 3, 2024

(54) AUTONOMOUS DETECTION OF CONCEALED WEAPONS AT A DISTANCE BY SENSOR FUSION

(71) Applicant: Konica Minolta Business Solutions U.S.A., Inc., San Mateo, CA (US)

(72) Inventor: Jun Amano, Hillsborough, CA (US)

(73) Assignee: Konica Minolta Business Solutions U.S.A., Inc., San Mateo, CA (US)

( * ) Notice: Subject to any disclaimer, the term of this patent is extended or adjusted under 35 U.S.C. 154(b) by 233 days.

(21) Appl. No.: 17/750,838

(22) Filed: May 23, 2022

(65) Prior Publication Data

US 2023/0375736 A1 Nov. 23, 2023

(51) Int. Cl.
| | |
|---|---|
| *G01V 3/08* | (2006.01) |
| *G01R 33/09* | (2006.01) |
| *G06V 10/764* | (2022.01) |
| *G06V 10/774* | (2022.01) |
| *G06V 10/82* | (2022.01) |

(52) U.S. Cl.
CPC .......... *G01V 3/081* (2013.01); *G01R 33/096* (2013.01); *G06V 10/764* (2022.01); *G06V 10/774* (2022.01); *G06V 10/82* (2022.01); *G06V 2201/05* (2022.01)

(58) Field of Classification Search
CPC .. G01V 3/081; G01R 33/096; G01R 33/0094; G06V 10/764; G06V 10/774; G06V 10/82; G06V 2201/05
USPC ........................................................ 324/260
See application file for complete search history.

(56) References Cited

U.S. PATENT DOCUMENTS

| | | | |
|---|---|---|---|
| 7,013,245 B2 | 3/2006 | Kotter et al. | |
| 7,970,103 B1* | 6/2011 | Hynes | G01V 5/20 |
| | | | 378/57 |
| 2017/0176623 A1* | 6/2017 | Appleby | G01V 3/104 |
| 2017/0270366 A1* | 9/2017 | Kuznetsov | G01V 3/12 |
| 2018/0210039 A1* | 7/2018 | Shalev | G01V 3/081 |
| 2019/0370614 A1* | 12/2019 | Crouch | G06V 10/7515 |
| 2020/0135004 A1* | 4/2020 | Ellenbogen | G01V 3/10 |
| 2021/0033743 A1 | 2/2021 | Keene | |

(Continued)

OTHER PUBLICATIONS

Daubaras, A., and M. Zilys. "Vehicle detection based on magneto-resistive magnetic field sensor." Elektronika ir Elektrotechnika 118.2 (2012): 27-32. (Year: 2012).*

(Continued)

*Primary Examiner* — Christopher P McAndrew
(74) *Attorney, Agent, or Firm* — Osha Bergman Watanabe & Burton LLP

(57) ABSTRACT

An apparatus for distant detection of ferrous metallic objects includes a plurality of magnetic field sensors and a fingerprint processing system. The plurality of magnetic field sensors each measure an ambient magnetic field. The fingerprint processing system receives, from the plurality of magnetic field sensors, magnetic field data corresponding to the ambient magnetic field. The fingerprint processing system also generates, from the magnetic field data, a magnetic fingerprint image of one or more perturbations of the ambient magnetic field. The plurality of magnetic field sensors is separated from the ferrous metallic objects being detected by a detection distance that is greater than or equal to 0.5 meters.

16 Claims, 8 Drawing Sheets

(56) References Cited

U.S. PATENT DOCUMENTS

2022/0136853 A1* 5/2022 Ferencz ............ G01C 21/3602
　　　　　　　　　　　　　　　　　　　　　701/423

OTHER PUBLICATIONS

Huan Liu et al., "Magnetic gradient full-tensor fingerprints for metallic objects detection of a security system based on anisotropic magnetoresistance sensor arrays"; AIP Advances 10; pp. 015329-1-015329-9; Published Jan. 21, 2020 (10 pages).

* cited by examiner

AUTONOMOUS DETECTION OF CONCEALED WEAPONS AT A DISTANCE BY SENSOR FUSION

BACKGROUND

Violence involving weapons and firearms, including mass shootings, continue to be a major problem in modern society. Often, individuals commit violent acts with weapons that are transported as concealed weapons. For example, many mass shootings and acts of terrorism have been committed by individuals who evaded detection by transporting concealed weapons into a school, business, public transport system, or public event. However, detection of concealed weapons in high-traffic or public settings is difficult using existing technologies. Therefore, a technology that can autonomously detect and identify concealed weapons, in real-time and from a distance, is highly desirable. A system that can perform these functions could prevent weapons-related casualties and acts of terrorism, while bolstering the public's confidence that public spaces such as schools, public transport systems, and large events are safe.

SUMMARY

In general, one or more embodiments of the invention relate to an apparatus for distant detection of ferrous metallic objects, the apparatus comprising: a plurality of magnetic field sensors that each measure an ambient magnetic field; and a fingerprint processing system, wherein the fingerprint processing system: receives, from the plurality of magnetic field sensors, magnetic field data corresponding to the ambient magnetic field, and generates, from the magnetic field data, a magnetic fingerprint image of one or more perturbations of the ambient magnetic field, wherein the plurality of magnetic field sensors is separated from the ferrous metallic objects being detected by a detection distance that is greater than or equal to 0.5 meters.

In general, one or more embodiments of the invention relate to a method for distant detection of ferrous metallic objects, the method comprising: receiving, from a plurality of magnetic field sensors, magnetic field data corresponding to an ambient magnetic field; generating, from the magnetic field data, a magnetic fingerprint image of one or more perturbations of the ambient magnetic field; and classifying, using a pretrained magnetic fingerprint image classifier, the magnetic fingerprint image into one of a set of classes that each correspond to a different type of ferrous metallic object.

In general, one or more embodiments of the invention relate to a non-transitory computer readable medium (CRM) storing computer readable program code for distant detection of ferrous metallic objects, the computer readable program code causes a computer to: receive, from a plurality of magnetic field sensors, magnetic field data corresponding to an ambient magnetic field; generate, from the magnetic field data, a magnetic fingerprint image of one or more perturbations of the ambient magnetic field; and classify, using a pretrained magnetic fingerprint image classifier, the magnetic fingerprint image into one of a set of classes that each correspond to a different type of ferrous metallic object.

Other aspects of the invention will be apparent from the following description and the appended claims.

DETAILED DESCRIPTION

Figure 1:
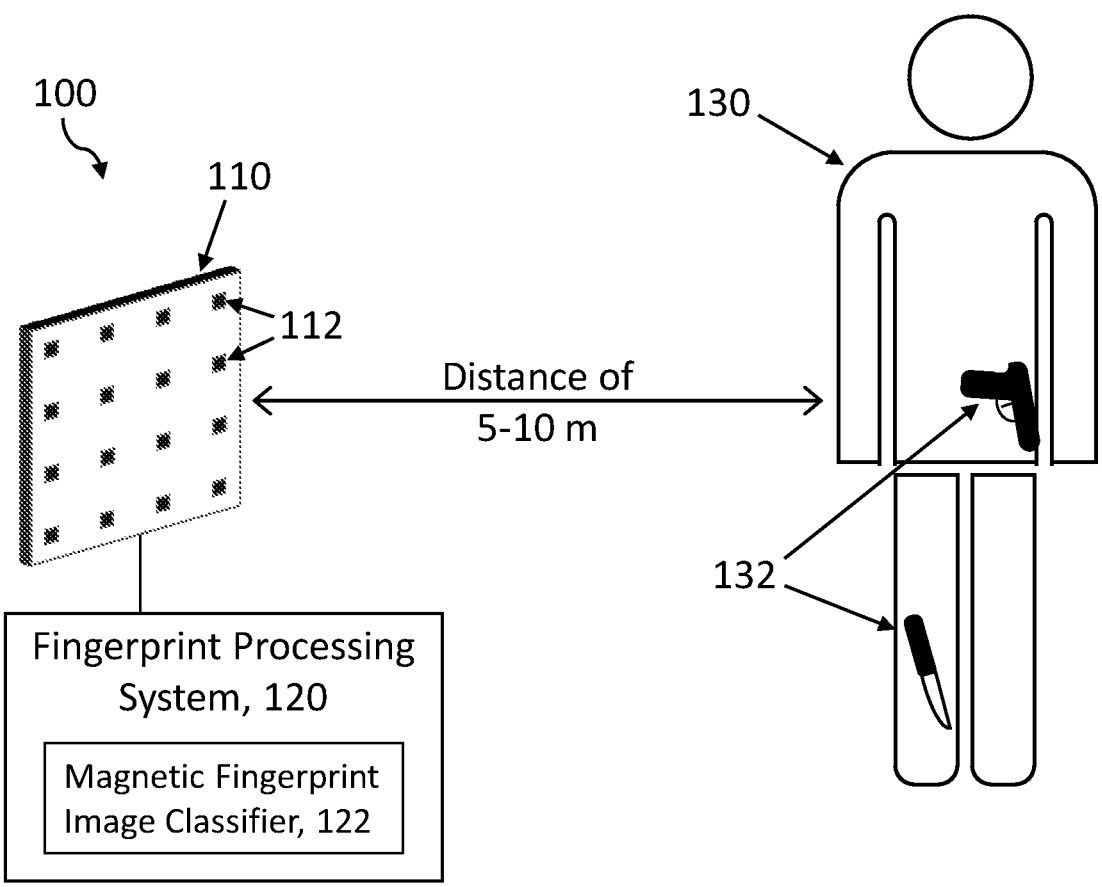
FIG. 1 shows a schematic view of an apparatus for distant detection of ferrous metallic objects, according to one or more embodiments.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third) may be used as an adjective for an element (i.e., any noun in the application). The use of ordinal numbers is not to imply or create a particular ordering of the elements nor to limit any element to being only a single element unless expressly disclosed, such as by the use of the terms "before," "after," "single," and other such terminology. Rather the use of ordinal numbers is to distinguish between the elements. By way of an example, a first element is distinct from a second element, and the first element may encompass more than one element and may succeed (or precede) the second element in an ordering of elements.

In general, embodiments of the invention provide an apparatus, a method, and a non-transitory computer readable medium (CRM) for distant detection of small ferrous metallic objects such as weapons. The great majority of weapons, such as firearms, knifes, and hammers, incorporate ferrous metals, and ferrous metals distort the Earth's magnetic field.

Therefore, measuring distortion in the Earth's field can detect the presence of weapons in passive manner.

In one or more embodiments, an array of magnetic sensors senses an ambient magnetic field at a distance of, for example, over 10 meters from an area where people are located who may be carrying small ferrous metallic objects or weapons (i.e., a sensing volume). Each magnetic field sensor senses perturbations in the ambient magnetic field caused by the ferrous metallic objects within the sensing volume, and the magnetic field data collected by each sensor is transmitted to a magnetic fingerprint processing system. Because the sensors are disposed in an array, and because a ferrous metallic object may be moving within the sensing volume, the fingerprint processing system can generate an image (referred to as a magnetic fingerprint image) of any time-dependent disturbances within the sensing volume. This magnetic fingerprint image can include both spatial information and a signature or "fingerprint" of the disturbance, or perturbation, of the ambient magnetic field. The magnetic fingerprint image may be classified by a pretrained machine learning algorithm, e.g., a convolutional neural network operating on the magnetic fingerprint image (magnetic data CNN). The machine learning algorithm may be trained using either artificially-generated or empirically-generated standard magnetic fingerprint images of known objects. In some embodiments, the magnetic fingerprint image may be spatially correlated with an optical image collected by a separate optical camera. The optical image data may also be processed using another convolutional neural network (an optical data CNN) in order to identify and track individual persons within the sensing volume. By correlating the magnetic fingerprint image plus the output of the magnetic data CNN with the optical image plus the output of the optical data CNN, the individual in possession of the ferrous metallic object or weapon can be determined as well as the location and type the object or weapon. Additionally, this sensor fusion process of correlating optical image data with magnetic fingerprint data while processing the data using both CNNs in parallel may allow weapons to be detected, attributed to an individual, located, and tracked in real-time without any input from a human agent.

FIG. 1 shows a schematic view of an apparatus 100 for distant detection of concealed ferrous metallic objects, according to one or more embodiments. The apparatus 100 comprises a magnetic sensor array 110, including magnetic field sensors 112, and a fingerprint processing system 120 that includes a magnetic fingerprint classifier 122. The magnetic field sensors measure the ambient magnetic field and transmit magnetic field data to the fingerprint processing system 120. The fingerprint processing system 120 receives the magnetic field data from the sensors 112 and processes the data in order to generate a magnetic fingerprint image of any perturbations of the ambient magnetic field. These perturbations of the ambient magnetic field may correspond to ferrous metallic objects 132 (e.g., weapons) within a sensing volume of the magnetic sensor array. In one or more embodiments, the fingerprint processing system 120 may determine the presence, location, and type of the ferrous metallic object 132 based on the magnetic fingerprint image, using the magnetic fingerprint image classifier 122.

The ambient magnetic field refers to the background magnetic field that exists in any volume of space where the apparatus is in operation (i.e., the sensing volume). The ambient magnetic field includes the Earth's magnetic field plus any other magnetic fields that originate from any sources, including local sources nearby the sensing volume of the magnetic sensor array 110.

In one or more embodiments, the magnetic field sensors 112 may be anisotropic magnetoresistance (AMR) sensors that are capable of detecting perturbations of the ambient magnetic field that are greater than or equal to, for example, 10 nanoTesla. However, in other embodiments, the magnetic field sensors 112 may have sensitivities such that they are capable of detecting perturbations of the ambient magnetic field that are greater than or equal to 1 nanoTesla, 2 nanoTesla, 5 nanoTesla, 25 nanoTesla, or 50 nanoTesla. AMR sensors have a sensing range that is well-suited to sensing the Earth's magnetic field. AMR sensors can sense DC static fields as well as the strength and direction of the field. In one or more embodiments, the magnetic field sensor may be a RM3100 manufactured by PNI Corporation. In one or more embodiments, the magnetic field sensor may be a HMC2003 manufactured by Honeywell Corporation. However, any magnetic field sensor or magnetometer, from any vendor, or that operates based on any physical principle for measuring a magnetic field, may be used, provided that it has sufficient sensitivity.

By detecting perturbations of this magnitude in the ambient magnetic field, a magnetic field sensor 112 is able to sense disturbances of the ambient magnetic field caused by small ferrous metallic objects 132 or weapons that are located at a detection distance of between 0.5 meters away and up to more than ten meters away from the magnetic field sensor 112. For example, the detection distance may be 0.5 meters, two meters, five meters, ten meters, or more. A small ferrous metallic object 132 may be any object that includes ferrous metallic components and is of a size that can be carried or moved by person 130. For the purposes of this disclosure, a weapon may be considered to be any small ferrous metallic object as described above. Examples of weapons and small ferrous metallic objects may include, but are not limited to: a knife, handgun, rifle, shotgun, hammer, scissors, explosive device, baton, key, or any other ferrous metallic object that can be carried by a person 130.

Figure 2A:
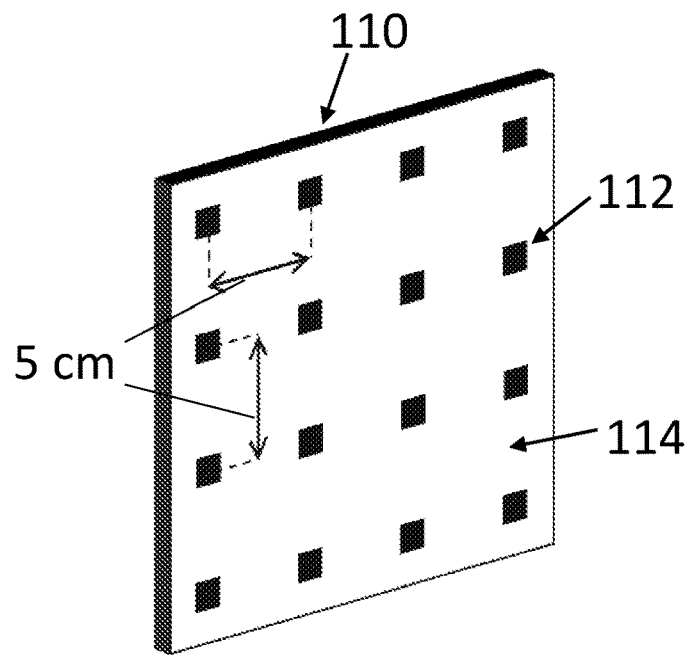
FIG. 2A shows a perspective schematic of a magnetic sensor array, according to one or more embodiments.
Figure 2B:
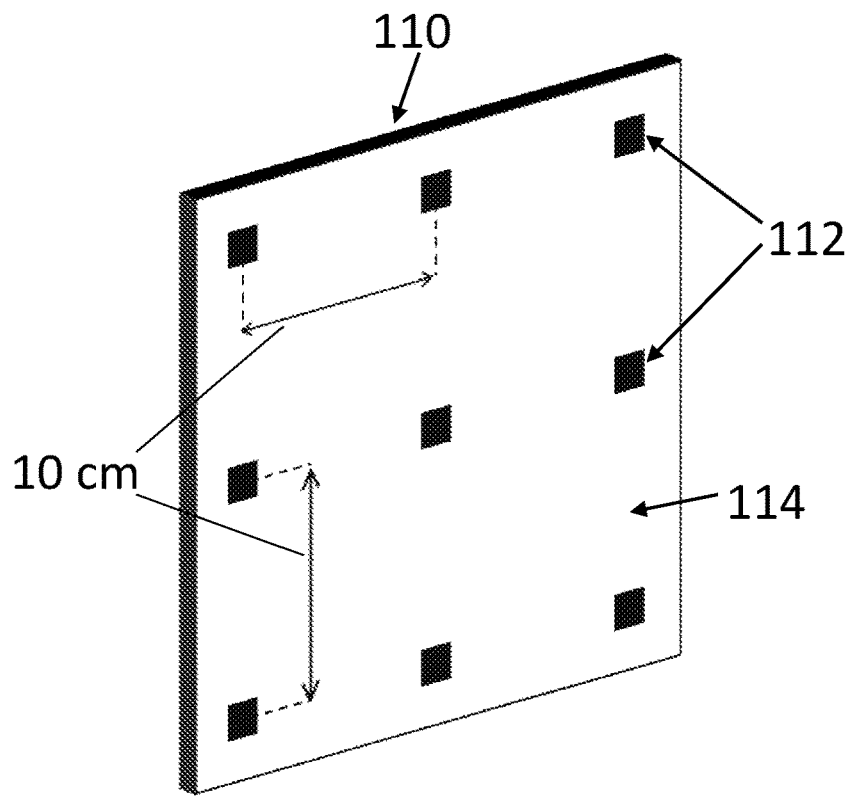
FIG. 2B shows a perspective schematic of a magnetic sensor array, according to one or more embodiments.
Figure 2C:
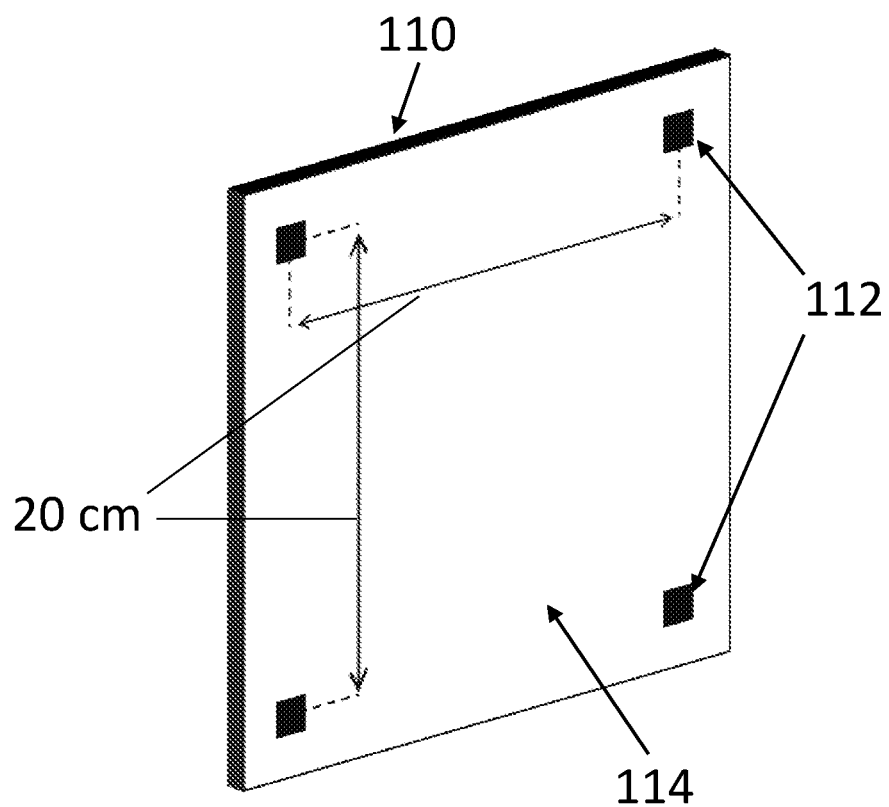
FIG. 2C shows a perspective schematic of a magnetic sensor array, according to one or more embodiments

FIGS. 2A and 2B show the magnetic sensor array 110 according to different embodiments of the invention. In these embodiments, the magnetic field sensors 112 are organized as a magnetic sensor array comprising in rows and columns, where each of the rows are orthogonal to each of the columns. For example, as shown in FIG. 2A, the magnetic sensor array 110 may include 16 magnetic field sensors 112, disposed in a 4×4 square array. In this embodiment, the rows and columns of the magnetic field sensors 112 are spaced by a separation distance that is 5 centimeters (cm), where the separation distance is the distance between adjacent magnetic field sensors 112. In other words, each of the magnetic field sensors 112 is separated from each of its nearest neighbor sensors by a separation distance of 5 cm. As a second example, shown in FIG. 2B, the magnetic field sensors 112 may also be disposed in a 3×3 square array, where the separation distance is 10 cm. As a third example, shown in FIG. 2C, the magnetic field sensors 112 may also be disposed in a 2×2 square array, where the separation distance is 20 cm. The separation distance between the magnetic field sensors 112 is related to the spatial resolution achievable in the magnetic fingerprint images that are generated from the magnetic field data measured by the sensors in the array. For example, the embodiment of the magnetic sensor array 110 shown in FIG. 2A may be capable of a spatial resolution of 5 cm, the embodiment of the magnetic sensor array 110 shown in FIG. 2B may be capable of achieving a spatial resolution of 10 cm, and the embodiment of the magnetic sensor array 110 shown in FIG. 2C may be capable of achieving a spatial resolution of 20 cm. Although FIGS. 2A, 2B, and 2C depict the magnetic field sensors 112 disposed in a square array, several different shapes, such as a cross, a square, a triangle, or any other suitable one-dimensional or two-dimensional arrangement of the magnetic field sensors 112, as well as any number of sensors may also be used.

In one or more embodiments, the magnetic sensor array 110 includes a panel 114 to which the magnetic field sensors 112 are attached. The panel 114 supports the magnetic field sensors 112. The panel 114 may be made from or include any suitable materials including plastics or circuit board materials or any other suitable material. The magnetic sensors may be attached to the panel 114 by any type of attachment materials. In one or more embodiments, the magnetic sensor array 110 may comprise additional components including electric circuits, signal processors, processors, microcontrollers, field programmable gate arrays, wiring, batteries, or other electronic or wireless components. These additional components may perform tasks relating to controlling the operation of the magnetic field sensors 112, for processing the data acquired by the magnetic field sensors 112, or for transmitting data to the fingerprint processing system 120.

Returning to FIG. 1, the magnetic sensor array 110 may be directly connected to the fingerprint processing system 120 by physical wires or cables for data transmission, or the magnetic sensor array 110 and the fingerprint processing system 120 may not be physically connected to each other by cables or wires. In the latter case, data may be transmitted from the magnetic sensor array and received by the fingerprint processing system 120 by wireless communication such as WiFi, cellular networks, or any other wireless connection. For the purposes of this disclosure, the term "connected" may refer to both the wired and wireless connections between the magnetic sensor array 110 and the fingerprint processing system 120. Accordingly, the magnetic sensor array 110 and the fingerprint processing system 120 may be physically separated by any distance. In some embodiments, the fingerprint processing system 120 may be disposed in a separate room away from the magnetic sensor array 110. In other embodiments, the fingerprint processing system 120 may also be directly attached to the magnetic sensor array 110 or to the panel 114, or the fingerprint processing system 120 may be incorporated into the panel 114.

The fingerprint processing system 120 may refer to any information processing system. For example, the fingerprint processing system 120 may refer to a processor which may be a central processing unit (CPU), graphics processing unit (GPU), microcontroller, field programmable gate array (FPGA), or other forms of information processing circuitry. Additionally, the fingerprint processing system 120 may also refer to any computing system implemented according to FIG. 7, which may include a server, desktop computer, workstation, laptop computer, tablet, phone, or any other computing device that may include a processor. Additionally, the fingerprint processing system 120 may include devices that have two or more processors, where each of these processors performs different functions related to receiving, transmitting, processing, classifying, storing, or retrieving the magnetic field data acquired by the magnetic field sensors 112.

The time-dependent geomagnetic field is disturbed by the ferrous metallic object 132 because of its relatively higher magnetic permeability. A minute disturbance in the earth's magnetic field can be detected by a sensitive magnetic field sensor 112 (i.e., an AMR magnetic sensor). In one or more embodiments, the AMR sensor array (110) may be used in a magnetic gradient full-tensor configuration in order to distinguish the weak signals by the small ferrous metallic objects from unknown interference, which could decrease the signal-to-noise ratio (SNR) and the detection distance (i.e., the range of the detection zone). For example, a simple square structure of the sensor array 110 with four sensors 112, as shown in FIG. 2C, produces the magnetic gradient full-tensor G:

$$G = \frac{1}{2d}\begin{bmatrix} (B_{1x}+B_{4x})-(B_{2x}+B_{3x}) & (B_{1y}+B_{4y})-(B_{2y}+B_{3y}) & (B_{1z}+B_{4z})-(B_{2z}+B_{3z}) \\ (B_{1x}+B_{2x})-(B_{3x}+B_{4x}) & (B_{1y}+B_{2y})-(B_{3y}+B_{4y}) & (B_{1z}+B_{2z})-(B_{3z}+B_{4z}) \\ (B_{1z}+B_{4z})-(B_{2z}+B_{3z}) & (B_{1z}+B_{2z})-(B_{3z}+B_{4z}) & (B_{2x}+B_{3x}+B_{3y}+B_{4y})-(B_{1x}+B_{1y}+B_{2y}+B_{4x}) \end{bmatrix}$$

where B is the magnetic strength vector, in in $B_{mn}$ stands for the number of each sensor, and n stands for the x, y, or z directional component (i.e., $B_{mn}$ refers to the magnetic intensity in the n direction that is measured by sensor in).

In one or more embodiments, the fingerprint processing system 120 receives, from the magnetic field sensors 112, magnetic field data that corresponds to measurements of the ambient magnetic field. As mentioned above, the fingerprint processing system 120 may receive the data via any form of wired or wireless data transmission. The fingerprint processing system generates, from the magnetic gradient full-tensor G, a magnetic fingerprint image of one or more perturbations of the ambient magnetic field. In one or more embodiments, a complete magnetic fingerprint image may be generated from the perturbations of the magnetic field as a ferrous metallic object 132 moves through the sensing volume of the magnetic sensor array (e.g., by being carried by a person 130 walking through the sensing volume). Each of the magnetic field sensors 112 in the magnetic sensor array 110 may sense a pulse-like change of the magnetic gradient full-tensor G (i.e., perturbation) in the ambient magnetic field. Due to the spatial separation (i.e., the separation distance) between each of the magnetic field sensors 112 in the magnetic sensor array 110, a phase-relationship and/or a time-delay relationship may exist between the pulse-like changes (i.e., time-dependent perturbations) of the ambient magnetic field that are measured by each sensor 112. Using these relationships between the perturbations measured by each sensor 112 in the array 110, the fingerprint processing system 120 may be able to compute spatial information about the location of the ferrous metal object 132 as it moves through the sensing volume of the magnetic sensor array 110. In some embodiments, the fingerprint processing system 120 may generate a magnetic fingerprint image of the perturbation of the ambient magnetic field at an instant in time as the ferrous metallic object moves through the sensing volume of the magnetic sensor array 110. In other embodiments, the fingerprint processing system 120 may generate a video of the perturbation of the magnetic field that includes multiple magnetic fingerprint images acquired at different instances in time as the ferrous metallic object 132 moves through the sensing volume of the magnetic sensor array 110.

In one or more embodiments, the magnetic fingerprint image generated by the fingerprint processing system 120 is classified by a pretrained magnetic fingerprint image classifier 122 to identify the type of the metallic object 132. In some embodiments, the magnetic fingerprint image classifier 122 is a convolutional neural network (CNN) (i.e., a magnetic data CNN), although other machine learning classifier may also be used. The magnetic data CNN is a type of neural network that includes an input layer, multiple hidden layers, and an output layer, where at least one of the hidden layers is a convolutional layer. Here, each layer represents an operation performed on the magnetic fingerprint image. Examples of the different types of hidden layers include, but are not limited to, convolutional layers, pooling layers, and fully connected layers. A convolutional layer takes an input (in this case the magnetic fingerprint image) and convolves the input with a learned filter or kernel. For example, the learned filter may be a small matrix of values that when applied at each pixel value of an image, the resulting output value represents the presence or absence of a particular feature in that region of the image. A pooling layer produces a scaled down, or down-sampled, version of the input. For example, a max pooling layer for an image outputs the maximum value of a range of nearby pixels for every pixel in the image. A fully connected layer uses the values of an input (commonly the output of other layers within the CNN) to classify the features found in other layers of the CNN. Each of the above-described types of hidden layers may be applied in various orders, and each hidden layer of the CNN may, itself, include several layers. In this way, the CNN is able to extract features and classify them from input data. In one or more embodiments, the CNN extracts features of the magnetic fingerprint image corresponding to perturbations of the ambient magnetic field and classifies these features/perturbations as corresponding to classes or groups of metallic objects.

The magnetic data CNN may classify the features in the magnetic fingerprint image as belonging to one of several pre-defined classes that the CNN has been trained to identify. The number of classes into which the CNN may classify the features of the magnetic fingerprint images is chosen based on the training data available that is used to train the CNN and the desired output of the CNN. In some embodiments, the features of the magnetic fingerprint image may be classified into one of 10 or more classes. However, fewer classes may also be used in other embodiments. Each of these classes corresponds to a different type of metallic object such as, but not limited to, the examples of metallic objects listed above. For example, in some embodiments, one or more of the classes may correspond to metallic objects that are weapons such guns, knives, etc. while other classes may correspond to non-weapon metallic objects such as keys, scissors, etc. In some embodiments, a class may correspond to the absence of a metallic object.

In one or more embodiments, the magnetic data CNN is trained using labeled training data that includes a set of standard labeled magnetic fingerprint images. These standard labeled magnetic fingerprint images are labeled as belonging to one of the classes of metallic objects discussed previously. Therefore, the CNN can be trained by adjusting the filters or kernels in the convolutional layers and/or other model parameters in order to correctly classify the training magnetic fingerprint images into the class associated with each training image's label. More specifically, in some embodiments, various types of machine learning algorithms, e.g., backpropagation algorithms, may be used to train the CNN or other machine learning models used to classify the magnetic fingerprint images. In a backpropagation algorithm, gradients are computed for each hidden layer of a neural network in reverse from the layer closest to the output layer proceeding to the layer closest to the input layer. As such, a gradient may be calculated using the transpose of the weights of a respective hidden layer based on an error function (also called a "loss function"). The error function may be based on various criteria, such as mean squared error function, a similarity function, etc., where the error function may be used as a feedback mechanism for tuning weights in the machine-learning model. In some embodiments, existing training data, e.g., images may be augmented to generate synthetic data for training a machine learning model.

While the above description relies on a CNN for the processing of the magnetic fingerprint images, any other type of machine learning algorithm suitable for this type of image processing may be used, without departing from the disclosure. Therefore, in one or more embodiments, the magnetic fingerprint image classifier 122 may be implemented as any machine learning or computer vision algorithm or model that is capable of classifying the magnetic fingerprints.

In one or more embodiments the standard labeled magnetic fingerprint images may be artificially-generated magnetic fingerprint images. The artificially-generated magnetic fingerprint images are generated by simulations of perturbations in a magnetic field that correspond to specific metallic objects. These simulations may be performed using any analytical or computer-based model that predicts or simulates changes in a magnetic field due to the presence of an object. Examples of modeling techniques that may be used to generate the training magnetic fingerprint images include, but are not limited to finite element method simulations (FEM), finite difference time domain (FDTD) simulations, analytical calculations based on the magnetic gradient full-tensor and other physical principles, or any other physical modeling technique. In other embodiments, the standard labeled magnetic fingerprint images may be empirically-generated by physically measuring magnetic fingerprint images of known objects using the apparatus 100 (including the magnetic sensor array 110 and the fingerprint processing system 120). In other embodiments, the set of training images may include both artificially-generated training images and empirically-generated training images.

In some embodiments, the set of labeled training images may comprise only the empirically-generated and/or artificially-generated training images, but in other embodiments, the set of labeled training images may also include variational labeled magnetic fingerprint images. The variational magnetic fingerprint images are variations of the standard labeled training images discussed above. In one or more embodiments, the variational magnetic fingerprint images are generated by a generative adversarial network (GAN), based on the artificially-generated and/or empirically-generated training images. The GAN includes a generator and a discriminator, which may both be neural networks. The GAN may be trained using images from the set of labeled training magnetic fingerprint images described above, where these labeled training images may be based on either the artificially-generated training images or the empirically-generated training images, or both. During training of the GAN, the generator may be provided with noise as the input and the discriminator may be provided with one or more labeled training magnetic fingerprint images that correspond to one of the classes discussed above. During the training, the generator may iteratively attempt to generate variational magnetic fingerprint images corresponding to the class while the discriminator may iteratively attempt to classify the variational magnetic fingerprint images as belonging or not belonging to that class. As the iterative training process continues, the generator becomes more skilled at generating variational magnetic fingerprint images corresponding to a particular class of metal object. In this way the GAN can produce a large number of variational magnetic fingerprint images that are based on the set of standard training magnetic fingerprint images. These variational magnetic fingerprint images, may in turn, be used to provide a large amount of training data for the CNN that is used to classify the magnetic fingerprint images in deployment. Therefore, based on a much larger set of training data, the deployed CNN may have increased accuracy in classifying the magnetic fingerprint images as corresponding to the correct metal objects.

Figure 3:
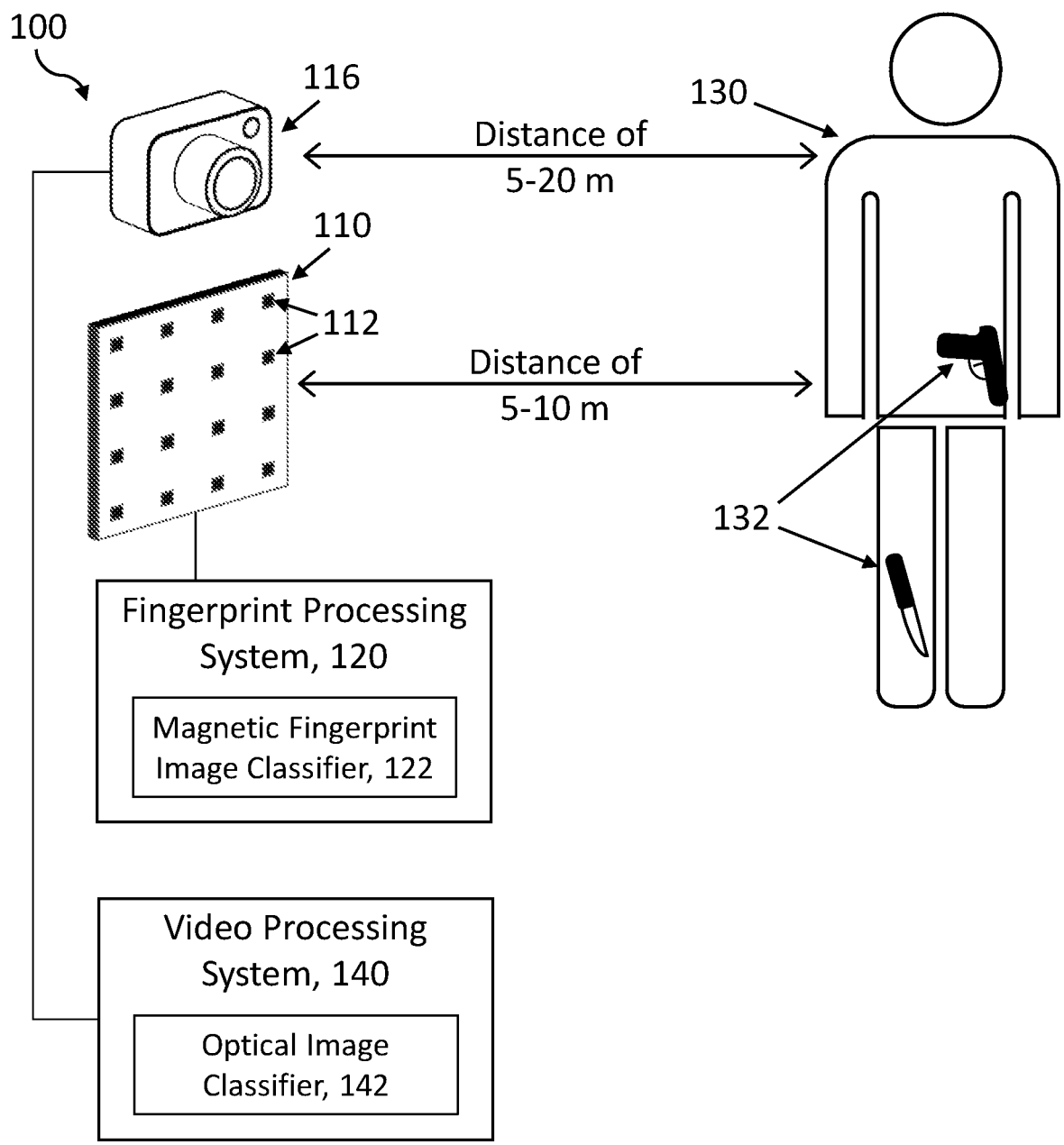
FIG. 3 shows a schematic view of an apparatus for distant detection of ferrous metallic objects, in operation, according to one or more embodiments.

FIG. 3 shows a schematic view of the apparatus 100 for distant detection of ferrous metallic objects, in operation, according to one or more embodiments. In the embodiment shown in FIG. 3, the apparatus 100 additionally includes a camera 116. In one or more embodiments, the camera may be a complementary metal-oxide-semiconductor (CMOS) camera that senses and images visible light. However, in other embodiments the camera may be a charge coupling device (CCD) camera or any other type of camera that produces images based on visible light or infrared radiation that is sensed by the camera 116. The camera 116 may take optical images of the sensing volume of the magnetic sensor array 110 simultaneously while the magnetic sensors detect perturbations in the ambient magnetic field. In this way, the camera is able to produce images of each person 130 that moves through the sensing volume, allowing the spatial information from the magnetic fingerprint images to be correlated with spatial information from the optical images.

In one or more embodiments, the camera 116 may be directly connected to a video processing system 140 by physical wires for data transmission, or the camera 116 and the video processing system 140 may not be physically connected by wires or cables. In the latter case, data may be transmitted from the magnetic sensor array and received by the video processing system 140 by wireless communication such as WiFi, cellular networks, or any other wireless connection. For the purposes of the disclosure, the term "connected" refers to both the wired and wireless connections between the camera 116 and the video processing system 140. Accordingly, the camera 116 and the video processing system 140 may be physically separated by any distance. In some embodiments, the video processing system 140 may be disposed in a separate room away from the camera 116. FIG. 3 shows an embodiment where the camera 116 and the magnetic sensor array 110 are connected to different processing systems 120 and 140, respectively. However, in some embodiments, the same processing system may be used for transmitting, receiving, and processing the optical image data from the camera 116 and the magnetic field data from the magnetic sensor array 110. Additionally, in some embodiments the camera 116 may include an internal processor that performs some or all of the processing of the optical images.

In one or more embodiments, an optical image classifier 142 in the video processing system 140 is employed to identify persons within the optical image acquired by the camera. In some embodiments, this optical image classifier 142 is also a convolutional neural network (i.e., an optical data CNN) that may be trained similarly to the magnetic data CNN described above. In some embodiments, the optical data CNN may be pretrained using labeled images taken from any available databases of optical images of persons. In other embodiments, the labeled training images may be acquired by the camera 116 itself, or any other camera, and later labeled to indicate the presence or absence of a person. By training the optical data CNN to identify persons moving through the sensing volume, individual persons can be identified, located, and tracked. Additionally, the outputs from the magnetic data CNN and the optical data CNN can be combined and spatially correlated in a sensor fusion process. In other embodiments, the optical image classifier 142 may be implemented as any machine learning or computer vision algorithm or model that is capable of classifying or identifying a person within the optical image.

Figure 4:
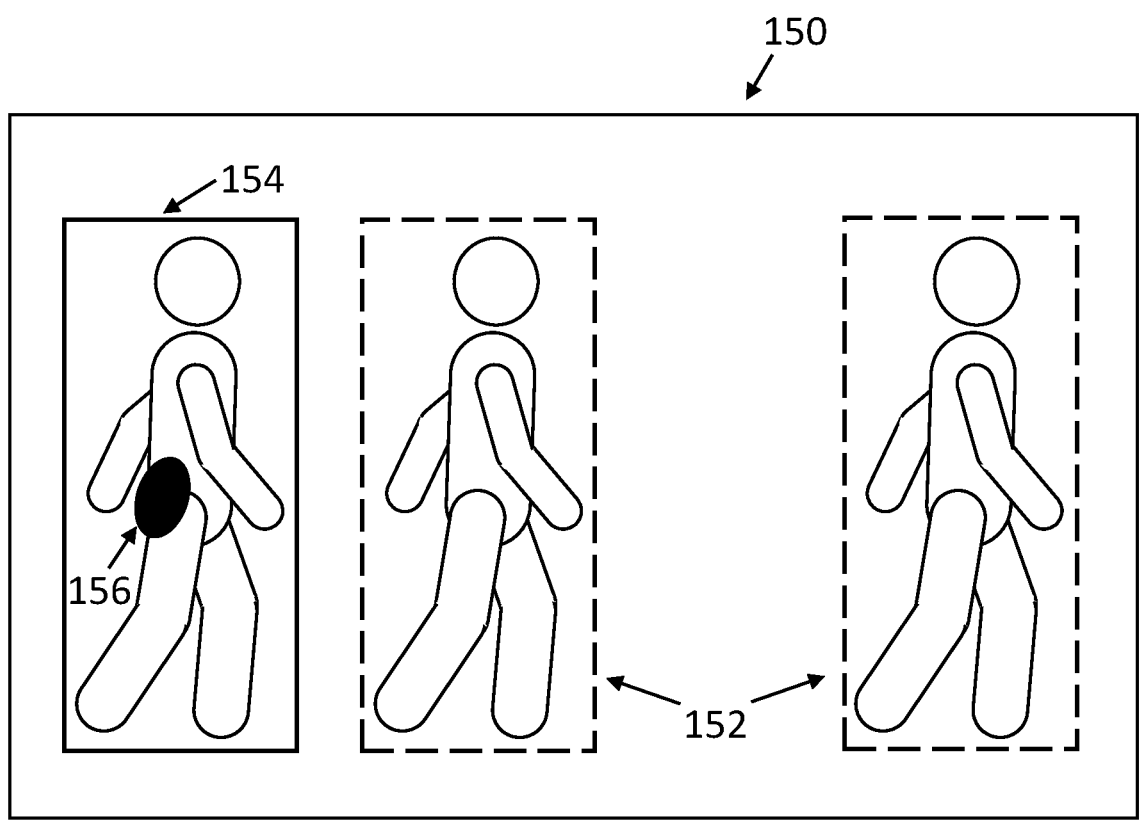
FIG. 4 shows an example output from a sensor fusion process according to one or more embodiments.

FIG. 4 shows an illustration of an example output from this sensor fusion process according to one or more embodiments. In FIG. 4 the illustrated optical image 150 from the camera 116 shows that there are several persons walking through the sensing volume of the apparatus 100. The dotted squares 152 indicate persons identified by the optical data CNN for whom no magnetic perturbation that could be classified into a class of interest was identified by the magnetic data CNN. The solid square 154 indicates a person that was identified by the optical data CNN for whom the magnetic data CNN has identified a perturbation in the ambient magnetic field in the magnetic fingerprint image that was classified as an object of interest 156 (e.g., a metallic weapon). Additionally, because the magnetic fingerprint image is spatially correlated with the optical image, the location of the object of interest 156 can be determined, as shown in FIG. 4 (located on the person's right side, in this case). In this way, the sensor fusion process is able to autonomously (i.e., without any input from a human) identify a potential concealed weapon, determine the type of the weapon, associate the weapon with a particular person, and locate the weapon on the person.

Figure 5:
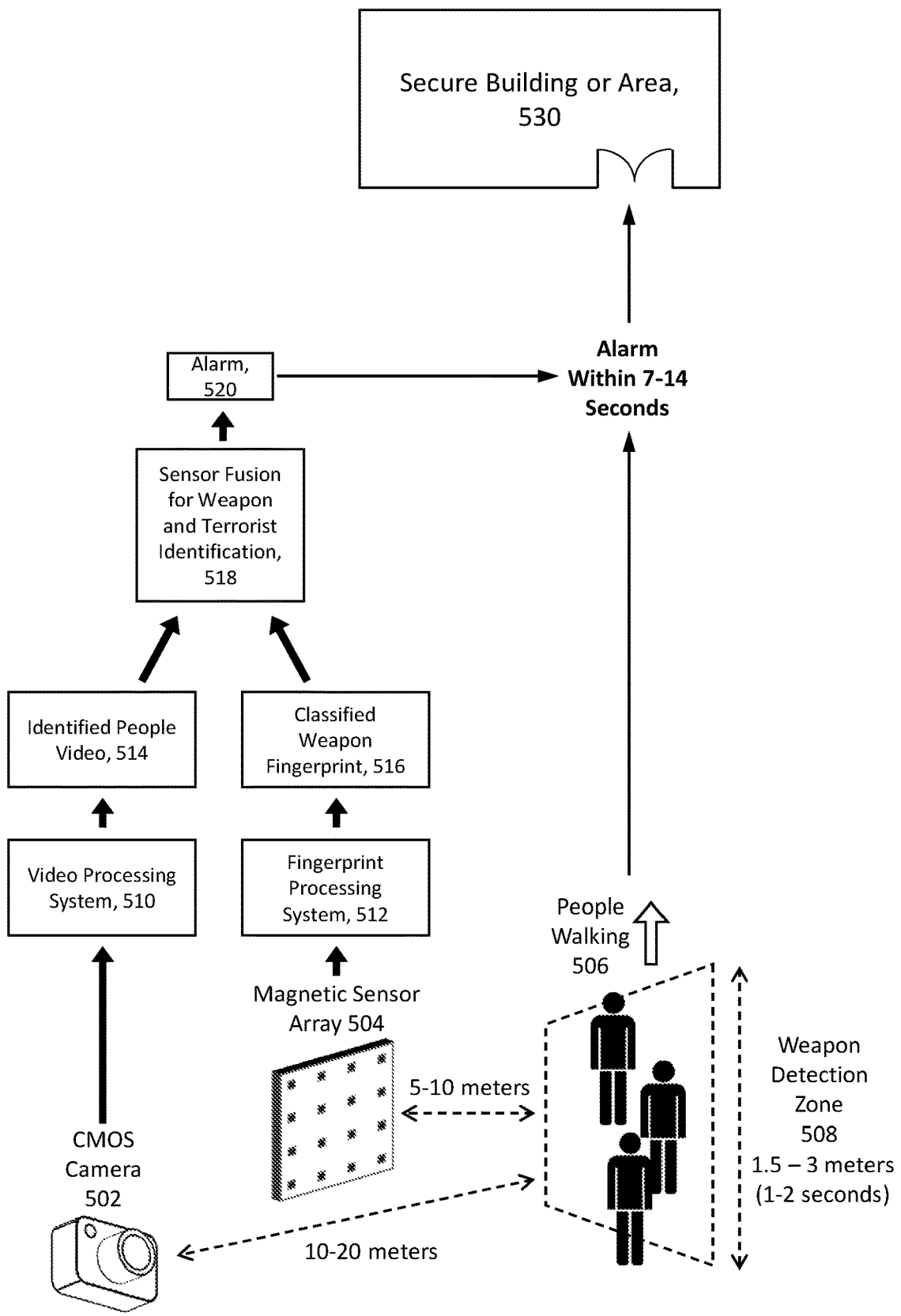
FIG. 5 shows a combined schematic and flowchart of an implementation of the above-described sensor fusion process, according to one or more embodiments.

FIG. 5 shows a combined schematic and flowchart of an implementation of the above-described sensor fusion process, according to one or more embodiments. In this embodiment, people 506 walk through the weapon detection zone 508. The weapon detection zone may have a length of 1.5-3 meters in the direction that the people are walking, when the magnetic sensor array 504 is disposed 5-10 meters away from the weapon detection zone 508. Therefore, the people 506 are within the weapon detection zone for approximately 1-2 seconds. The position of the weapon detection zone 508 is chosen to allow enough time for processing of data and weapon detection to occur before the people 506 can walk to the entrance of a secure building or area 530. During this time, the magnetic field sensors in the magnetic sensor array 504 sense perturbations of the ambient magnetic field as the people 506 transit the weapon detection zone 508 and transmit data representative of the perturbations to a processing system for processing. Simultaneously, the CMOS Camera 502 senses light or infrared radiation scattered by the people 506 within the weapon detection zone 508 and transmits data representative of the optical radiation that was sensed to a processing system for processing. The video processing system 510, and the fingerprint processing system 512 generate an identified people video image 514 based on the sensed optical radiation and generate a classified weapon image 516 (i.e., a magnetic fingerprint image) based on the perturbations of the ambient magnetic field. The classified weapon image 516 can be generated within approximately 1-2 seconds after the perturbations of the magnetic field are first sensed by the magnetic sensor array 504. One or more processors perform the sensor fusion process 518 to identify persons within the people video image 514 and classify weapons within the weapon image 516 as well as correlate these images spatially. These identification and classification processes are performed using convolutional neural networks, as described previously. If a weapon is detected, an alarm 520 is activated autonomously. The total time for these autonomous processes including sensing, processing data, and identification of weapons and/or people/terrorists is between 7-14 seconds. In other words, within 7-14 seconds, the presence of a weapon, identification and location of the weapon, and identification of the person carrying the weapon can be determined and an alarm can be activated. This fast time-to-alarm allows for a response or action to be taken before person/terrorist carrying the weapon can enter the secure building or area 530.

Figure 6:
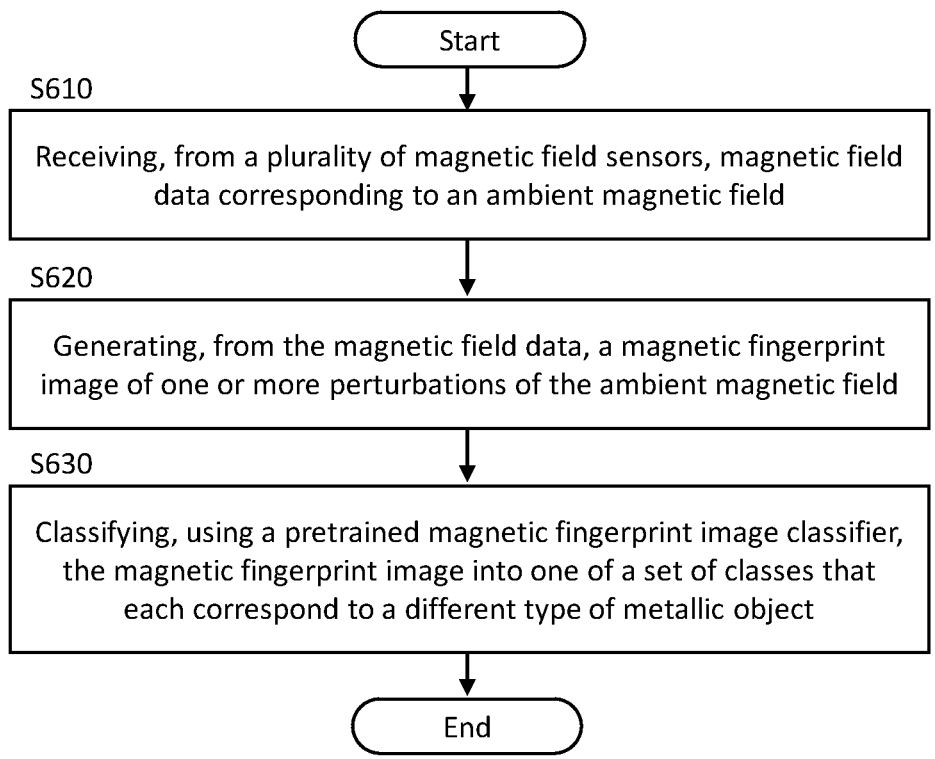
FIG. 6 shows a flowchart of a method for distant detection of ferrous metallic objects, according to one or more embodiments of the invention.

FIG. 6 shows a flowchart of a method for distant detection of metallic objects, according to one or more embodiments of the invention. One or more individual processes shown in FIG. 6 may be omitted, repeated, and/or performed in a different order than the order shown in FIG. 6. Accordingly, the scope of the invention should not be limited by the specific arrangement as depicted in FIG. 6.

At 5610, magnetic field data, corresponding to an ambient magnetic field is received from a plurality of magnetic field sensors.

At 5620, a magnetic fingerprint image, of one or more perturbations of the ambient magnetic field, is generated from the magnetic field data.

At 5630, the magnetic fingerprint image is classified, using a pretrained convolutional neural network, into one of a set of classes, wherein the set includes classes that each correspond to a different type of metallic object.

Figure 7:
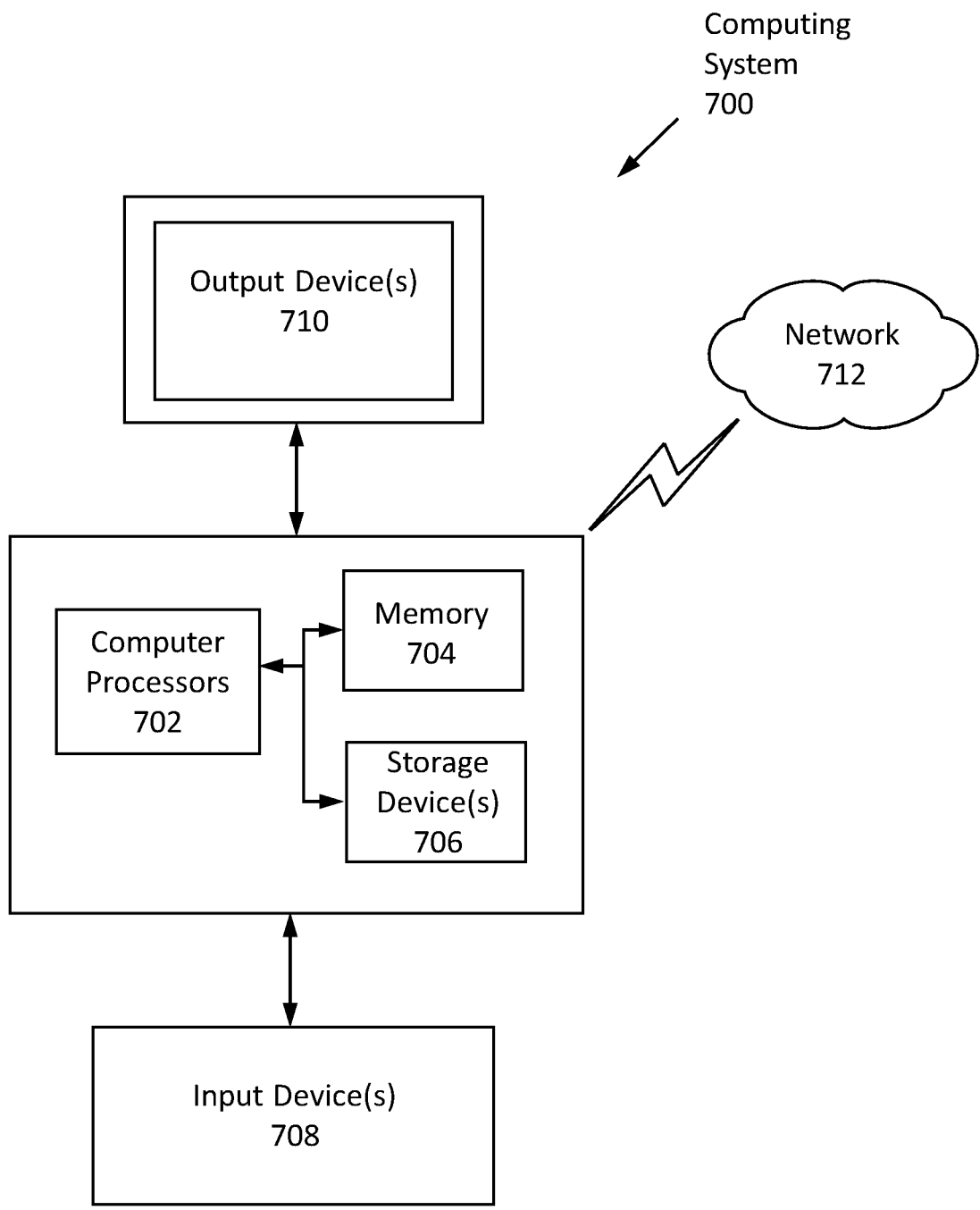
FIG. 7 shows a computing system, according to one or more embodiments.

Embodiments of the invention may be implemented on virtually any type of computing system, regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of the invention. For example, as shown in FIG. 7, the computing system (700) may include one or more computer processor(s) (702), associated memory (704) (e.g., random access memory (RAM), cache memory, flash memory, etc.), one or more storage device(s) (706) (e.g., a hard disk, an optical drive such as a compact disk (CD) drive or digital versatile disk (DVD) drive, a flash memory stick, etc.), and numerous other elements and functionalities. The computer processor(s) (702) may be an integrated circuit for processing instructions. For example, the computer processor(s) may be one or more cores, or micro-cores of a processor. The computing system (700) may also include one or more input device(s) (708), such as a touchscreen, keyboard, mouse, microphone, touchpad, electronic pen, or any other type of input device. Further, the computing system (700) may include one or more output device(s) (710), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (700) may be connected to a network (712) (e.g., a local area network (LAN), a wide area network (WAN) such as the Internet, mobile network, or any other type of network) via a network interface connection (not shown). The input and output device(s) may be locally or remotely (e.g., via the network (712)) connected to the computer processor(s) (702), memory (704), and storage device(s) (706). Many different types of computing systems exist, and the aforementioned input and output device(s) may take other forms.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention.

Further, one or more elements of the aforementioned computing system (700) may be located at a remote location and be connected to the other elements over a network (712). Further, one or more embodiments of the invention may be implemented on a distributed system having a plurality of nodes, where each portion of the invention may be located on a different node within the distributed system. In one or more embodiments, the node corresponds to a distinct computing device. Alternatively, the node may correspond to a computer processor with associated physical memory.

The node may alternatively correspond to a computer processor or micro-core of a computer processor with shared memory and/or resources.

One or more of the embodiments of the invention may have one or more of the following advantages and improvements over conventional technologies for detection of ferrous metallic objects or weapons: detection of weapons that are not in immediate proximity to the magnetic sensor array, e.g., from a distance of over 2 m away, 10 m away, etc.; autonomous identification of ferrous metallic objects or weapons that are concealed or hidden from view; the ability to determine the location of concealed weapons on a person; the ability to generate spatial images that depict the location of weapons or ferrous metallic objects that are not otherwise visible; the ability to autonomously identify a person carrying a weapon or ferrous metallic object and the ability associate the weapon or ferrous metallic object with the specific person carrying it; fully autonomous detection of weapons in real-time, such that no human input or intervention is necessary; the ability to detect weapons before the weapons are allowed to enter a public or secured space; the ability to detect weapons and/or terrorists in public spaces where checkpoints based on traditional metal detectors or imaging scanners are not feasible; and simplification and improved speed of security screening; improved accuracy of detecting threats at security checkpoints. Furthermore, each of the above-listed advantages of embodiments of the invention may additionally result in improved public safety due to prevention of violence and acts of terrorism as well as improved confidence in safety among the public attending public gatherings or utilizing public/mass transportation systems.

Although the disclosure has been described with respect to a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. An apparatus for distant detection of ferrous metallic objects, the apparatus comprising:
   a plurality of magnetic field sensors that each measure an ambient magnetic field; and
   a fingerprint processing system, wherein the fingerprint processing system:
      receives, from the plurality of magnetic field sensors, magnetic field data corresponding to the ambient magnetic field,
      generates, from the magnetic field data, a magnetic fingerprint image of one or more perturbations of the ambient magnetic field, and
      classifies, using a pretrained magnetic fingerprint image classifier, the magnetic fingerprint image into one of a set of classes that each correspond to a different type of ferrous metallic object, wherein
   the plurality of magnetic field sensors is separated from the ferrous metallic objects being detected by a detection distance that is greater than or equal to 0.5 meters, and
   the magnetic fingerprint image classifier is trained using labeled training data that includes a set of standard labeled fingerprint images selected from a group consisting of:
      a set of artificially-generated magnetic fingerprint images based on simulations of magnetic field perturbations that correspond to ferrous metallic objects,
      a set of empirically-generated magnetic fingerprint images, of known ferrous metallic objects, that are physically measured using the plurality of magnetic field sensors, and
      combinations of the set of artificially-generated magnetic fingerprint images and the set of empirically-generated magnetic fingerprint images.

2. The apparatus according to claim 1, wherein the labeled training data further comprises:
   variational labeled fingerprint images that are based on the set of standard labeled fingerprint images and are generated using a generative adversarial network.

3. The apparatus according to claim 1, wherein
   the plurality of magnetic field sensors is organized as a magnetic sensor array comprising rows and columns of magnetic field sensors, and
   each of the rows is orthogonal with each of the columns.

4. The apparatus according to claim 3, wherein
   the magnetic sensor array comprises at least four magnetic field sensors, disposed in a square array, and
   a separation distance, between adjacent magnetic field sensors, is less than or equal to 20 centimeters.

5. The apparatus according to claim 1, wherein each of the plurality of the magnetic field sensors is an anisotropic magnetoresistance sensor that has a sensitivity sufficient to measure perturbations of 10 nanoTesla in the ambient magnetic field.

6. A method for distant detection of ferrous metallic objects, the method comprising:
   receiving, from a plurality of magnetic field sensors, magnetic field data corresponding to an ambient magnetic field;
   generating, from the magnetic field data, a magnetic fingerprint image of one or more perturbations of the ambient magnetic field;
   classifying, using a pretrained magnetic fingerprint image classifier, the magnetic fingerprint image into one of a set of classes that each correspond to a different type of ferrous metallic object; and
   training the magnetic fingerprint image classifier using labeled training data that includes a set of standard labeled fingerprint images selected from a group consisting of:
      a set of artificially-generated magnetic fingerprint images based on simulations of magnetic field perturbations that correspond to ferrous metallic objects,
      a set of empirically-generated magnetic fingerprint images, of known ferrous metallic objects, that are physically measured using the plurality of magnetic field sensors, and
      combinations of the set of artificially-generated magnetic fingerprint images and the set of empirically-generated magnetic fingerprint images.

7. The method according to claim 6, wherein
   the plurality of magnetic field sensors is separated from the ferrous metallic objects being detected by a detection distance that is greater than or equal to 0.5 meters.

8. The method according to claim 6, wherein
   the plurality of magnetic field sensors is organized as a magnetic sensor array comprising rows and columns of magnetic field sensors, and
   each of the rows is orthogonal with each of the columns.

9. The method according to claim 8, wherein
   the magnetic sensor array comprises at least four magnetic field sensors, disposed in a square array, and a separation distance, between adjacent magnetic field sensors, is less than or equal to 20 centimeters.

10. The method according to claim 6, wherein each of the plurality of the magnetic field sensors is an anisotropic magnetoresistance sensor that has a sensitivity sufficient to measure perturbations of 10 nanoTesla in the ambient magnetic field.

11. The method according to claim 6, wherein the labeled training data further comprises:
variational labeled fingerprint images that are based on the set of standard labeled fingerprint images and are generated using a generative adversarial network.

12. A non-transitory computer readable medium (CRM) storing computer readable program code for distant detection of ferrous metallic objects, the computer readable program code causes a computer to:
receive, from a plurality of magnetic field sensors, magnetic field data corresponding to an ambient magnetic field;
generate, from the magnetic field data, a magnetic fingerprint image of one or more perturbations of the ambient magnetic field;
classify, using a pretrained magnetic fingerprint image classifier, the magnetic fingerprint image into one of a set of classes that each correspond to a different type of ferrous metallic object; and
train the magnetic fingerprint image classifier using labeled training data that includes a set of standard labeled fingerprint images selected from a group consisting of:
a set of artificially-generated magnetic fingerprint images based on simulations of magnetic field perturbations that correspond to ferrous metallic objects,
a set of empirically-generated magnetic fingerprint images, of known ferrous metallic objects, that are physically measured using the plurality of magnetic field sensors, and
combinations of the set of artificially-generated magnetic fingerprint images and the set of empirically-generated magnetic fingerprint images.

13. The non-transitory CRM according to claim 12, wherein
the plurality of magnetic field sensors is separated from the ferrous metallic objects being detected by a detection distance that is greater than or equal to 0.5 meters.

14. The non-transitory CRM according to claim 12, wherein
the plurality of magnetic field sensors is organized as a magnetic sensor array that comprises at least four magnetic field sensors, disposed in a square array, and
a separation distance, between each magnetic field sensor, is less than or equal to 20 centimeters.

15. The non-transitory CRM according to claim 12, wherein each of the plurality of the magnetic field sensors is an anisotropic magnetoresistance sensor that has a sensitivity sufficient to measure perturbations of 10 nanoTesla in the ambient magnetic field.

16. The non-transitory CRM according to claim 12, wherein the labeled training data further comprises:
variational labeled fingerprint images that are based on the set of standard labeled fingerprint images and are generated using a generative adversarial network.

* * * * *